(12) United States Patent
Valeri

(10) Patent No.: US 12,180,383 B2
(45) Date of Patent: Dec. 31, 2024

(54) CURABLE COATING COMPOSITION

(71) Applicant: Essilor International, Charenton-le-pont (FR)

(72) Inventor: Robert Valeri, Dallas, TX (US)

(73) Assignee: Essilor International, Charenton-le-pont (FR)

( * ) Notice: Subject to any disclaimer, the term of this patent is extended or adjusted under 35 U.S.C. 154(b) by 209 days.

(21) Appl. No.: 18/007,577

(22) PCT Filed: Jun. 3, 2021

(86) PCT No.: PCT/EP2021/064929
§ 371 (c)(1),
(2) Date: Dec. 1, 2022

(87) PCT Pub. No.: WO2021/245198
PCT Pub. Date: Dec. 9, 2021

(65) Prior Publication Data
US 2023/0220232 A1   Jul. 13, 2023

(30) Foreign Application Priority Data

Jun. 3, 2020 (EP) ..................................... 20305586

(51) Int. Cl.
| | |
|---|---|
| *C09D 133/10* | (2006.01) |
| *C09D 7/63* | (2018.01) |
| *C09D 133/12* | (2006.01) |
| *G02B 1/14* | (2015.01) |

(52) U.S. Cl.
CPC ............. *C09D 133/12* (2013.01); *C09D 7/63* (2018.01); *G02B 1/14* (2015.01)

(58) Field of Classification Search
CPC .................................................. C09D 133/10
See application file for complete search history.

(56) References Cited

U.S. PATENT DOCUMENTS

| | | | |
|---|---|---|---|
| 6,268,055 B1 | 7/2001 | Walters et al. | |
| 7,018,463 B2 | 3/2006 | Terry | |
| 2006/0231982 A1* | 10/2006 | You | C09D 151/085 |
| | | | 264/496 |
| 2014/0342100 A1* | 11/2014 | Valeri | B05D 3/067 |
| | | | 522/170 |
| 2017/0052446 A1* | 2/2017 | Tsai | G03F 7/0754 |
| 2018/0003861 A1* | 1/2018 | Valeri | B32B 27/00 |
| 2018/0113239 A1* | 4/2018 | Valeri | C08L 75/04 |

FOREIGN PATENT DOCUMENTS

| | | | |
|---|---|---|---|
| CN | 103666103 A * | 3/2014 | |
| JP | H10133370 | 5/1998 | |
| JP | 2003195003 | 7/2003 | |
| JP | 2003294906 | 10/2003 | |
| JP | 2007284622 | 11/2007 | |
| JP | 2009157233 A * | 7/2009 | |
| JP | 2013227485 | 11/2013 | |
| WO | WO 2001/018128 | 3/2001 | |
| WO | WO 2002/000561 | 1/2002 | |
| WO | WO 2011/075128 | 6/2011 | |
| WO | WO 2016/108061 | 7/2016 | |
| WO | WO 2016/178052 | 11/2016 | |

OTHER PUBLICATIONS

Nakayama et al. JP 2009157233 Translation. Jul. 2009 (Year: 2009).*
International Search Report and Written Opinion issued in Corresponding PCT Application No. PCT/EP2021/064929, dated Sep. 2, 2021.

* cited by examiner

*Primary Examiner* — Cachet I Proctor
(74) *Attorney, Agent, or Firm* — Norton Rose Fulbright US LLP

(57) ABSTRACT

The present invention relates to a curable coating composition, especially a radiation curable coating composition comprising at least one poly(meth)acrylate compound comprising at least 6 (meth)acrylate groups, at least one unsaturated silane compound, and at least one photoinitiator. Said at least one poly(meth)acrylate compound comprising at least 6 (meth)acrylate groups and said at least one unsaturated silane compound represent at least 95% of the weight of polymerizable compounds present in the composition. Upon radiation-curing, the composition provides an abrasion- and/or scratch-resistant coating.

19 Claims, No Drawings

CURABLE COATING COMPOSITION

CROSS-REFERENCE TO RELATED APPLICATIONS

This application is a national phase application under 35 U.S.C. § 371 of International Application No. PCT/EP2021/064929 filed 3 Jun. 2021, which claims priority to European Patent Application No. 20305586.8 filed 3 Jun. 2020. The entire contents of each of the above-referenced disclosures is specifically incorporated by reference herein without disclaimer.

The invention relates to curable coating compositions, especially radiation curable coating compositions, for preparing transparent, abrasion resistant, highly scratch resistant coatings, to optical articles coated therewith, especially ophthalmic articles, and a method of manufacturing such optical article.

It is a common practice in the art to coat at least one main surface of an optical substrate with several coatings for imparting to the finished article additional or improved optical or mechanical properties. These coatings are designated in general as functional coatings.

The various coatings that may be used to impart a plurality of mechanical and/or optical properties may be impact-resistant coating layers, abrasion- and/or scratch-resistant coating layers, anti-reflection and/or reflective coating layers, anti-fouling layers and/or anti-fog layers.

Resistance to abrasion and/or scratch of optical articles is usually not sufficient, which is critical for solar lenses for sunglasses with or without prescription having a reflective front face, as compared to classical non solar or antireflective lenses. Indeed, the presence of scratches on the reflective front face of a solar lens is particularly perceptible for a wearer or an observer due to the color and brightness contrast between the light reflected from the scratches and the light reflected from the undamaged surface of the coating. A wearer may undergo a reduction in the quality of the vision, while an observer may found the scratched solar lenses aesthetically less appealing. This is particularly the case for reflective lenses displaying a mirror effect. Mirror coatings generally have poor abrasion resistance and as such are easily damaged.

Different ways to improve the abrasion resistance of an optical article, which is sensitive to scratches from environment, can be found in the literature. Abrasion and scratch resistance properties are generally achieved by applying a hard coat to a base substrate.

It has been proposed to increase the total thickness of the anti-reflection coating, such as in JP 2003-195003 and JP 2003-294906, which describe a lens coated with a primer coating, a hard coat and a 7-layer anti-reflection coating comprising alternated layers of $SiO_2$ and $TiO_2$, the latter being deposited with ion assistance and known to be sensitive to photo-degradation.

WO 2016/178052 discloses a UV curable coating composition for ophthalmic lenses comprising at least one epoxy alkoxysilane, at least one polyfunctional acrylate monomer and/or polyfunctional epoxy compound, and at least one UV absorber.

WO 2016/108061 discloses an ophthalmic article comprising a first coating comprising an abrasion resistant coating including flexible materials, wherein the abrasion resistant coating is radiation-cured; and a second coating comprising a sputter-applied anti-reflective coating. The ophthalmic article has a Bayer value of at or between 1.25 and 2.6 and a hand steel wool value of 3 or less.

JP 2013-227485 discloses a curable resin composition containing silica fine particles, a silane coupling agent containing an epoxy group, a trifunctional or higher functional polyfunctional (meth) acrylate compound, and, as an essential component, an alkali soluble polymerizable resin (N-substituted maleimide-based monomer unit and/or a dialkyl-2,2'-(oxydimethylene) diacrylate-based simple substance) having a weight average molecular weight of 4000 to 50000.

US 2017/052446 discloses a photosensitive resin composition comprising an alkali-soluble polymerizable resin (A), a compound having a vinyl unsaturated group (B), a photoinitiator (C), a solvent (D), and a silane compound (E) comprising a silane compound (E-1), which is not an not unsaturated silane.

JP H10-133370 discloses a color filter composition comprising a polymerizable resin having carboxyl groups or phenol hydroxyl groups on the side chains, a photopolymerization initiator, monomers which are hardened by the effect of said initiator, pigments, solvents and a silane coupling agent.

JP 2007-284622 describes a surface protective layer obtained from a composition comprising (A): a block copolymer containing a polymer chain (X) having at least a fluorine-containing vinyl monomer unit and a polymer chain (Y) composed of a vinyl monomer unit having at least a silyl group capable of doing hydrolytic dehydrating condensation, and a silyl group hydrolysis dehydration condensation catalyst.

Other radiation curable hard coating compositions used to protect the optical surfaces of ophthalmic lenses are disclosed in WO 2001/018128, U.S. Pat. No. 8,033,663, WO 2002/000561 and U.S. Pat. No. 7,018,463.

Even with the best ophthalmic lens coatings that exist, wearers continue to experience scratches due to wear and exposure to harsh elements. There is a need for coatings with high scratch resistance equal to or superior to that of existing ophthalmic lens coatings to address these issues.

An objective of the current invention is to provide a transparent optical article comprising an organic or mineral glass substrate optionally bearing an interferential coating, preferably a lens, and more preferably an ophthalmic lens for eyeglasses, having an improved abrasion and/or scratch resistance over already known optical articles, coated with a hard coat having a robust adhesion to the substrate and a good resistance to heat and temperature variations. These properties should be obtained without decreasing the optical performances and other mechanical performances of said article, such as antireflection or reflection performance.

Still another aim of this invention is to provide a process of manufacturing the above defined article, which could be easily integrated into the classical manufacturing chain and would avoid heating the substrate.

The inventor observed that formulating a curable hard coating composition based on highly functional acrylic monomers gave high scratch resistance, however, the coating was very brittle and had a tendency to crack upon cure. Therefore, what was needed was a way to modify these acrylate based coatings to be less brittle while retaining their scratch resistance.

The inventor discovered that a combination of a highly functional acrylate with an unsaturated silane of lower functionality (reducing the crosslink density) resulted in a very highly scratch resistant coating adhering to lens substrates.

Thus, the present invention relates to a radiation-curable coating composition comprising at least one poly(meth)

acrylate compound comprising at least 6 (meth)acrylate groups, at least one unsaturated silane compound, and at least one initiator, preferably a photoinitiator, said at least one poly(meth)acrylate compound comprising at least 6 (meth)acrylate groups and said at least one unsaturated silane compound representing at least 95% of the weight of polymerizable compounds present in the composition.

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

When an optical article comprises one or more surface coatings, the phrase "to deposit a coating or layer onto the optical article" means that a coating or layer is deposited onto the outermost coating of the optical article, i.e. the coating which is the closest to the air.

A coating that is "on" a side of a lens is defined as a coating that (a) is positioned over that side, (b) need not be in contact with that side, i.e., one or more intervening coatings may be disposed between that side and the coating in question (although it is preferably in contact with that side) and (c) need not cover that side completely.

The term "coating" is understood to mean any layer, layer stack or film, which may be in contact with the substrate and/or with another coating, for example a sol-gel coating or a coating made of an organic resin. A coating may be deposited or formed through various methods, including wet processing, gaseous processing, and film transfer.

The optical article prepared according to the present invention is a transparent optical article, preferably an optical lens or lens blank, and more preferably an ophthalmic lens or lens blank. The optical article may be coated on its convex main face (front side), concave main face (back/rear side), or both faces with the multilayer interferential coating according to the invention.

In an embodiment, the optical article is coated on the back side of the lens, after the back side has been surfaced at a desired geometry (typically for a prescription lens).

As used herein, the rear face of the substrate is intended to mean the face which, when using the article, is the nearest from the wearer's eye, in the cases of lenses. It is generally a concave face. On the contrary, the front face of the substrate is the face which, when using the article, is the most distant from the wearer's eye. It is generally a convex face. The optical article can also be a plano article.

Herein, the term "lens" means an organic or inorganic glass lens, comprising a lens substrate, which may be coated with one or more coatings of various natures.

The term "ophthalmic lens" is used to mean a lens adapted to a spectacle frame, for example to protect the eye and/or correct the sight. Said lens can be chosen from afocal, unifocal, bifocal, trifocal and progressive lenses. Although ophthalmic optics is a preferred field of the invention, it will be understood that this invention can be applied to optical articles of other types, such as, for example, lenses for optical instruments, in photography or astronomy, optical sighting lenses, ocular visors, optics of lighting systems, etc.

In the present description, unless otherwise specified, an optical article/material is understood to be transparent when the observation of an image through said optical article is perceived with no significant loss of contrast, that is, when the formation of an image through said optical article is obtained without adversely affecting the quality of the image. This definition of the term "transparent" can be applied to all objects qualified as such in the description, unless otherwise specified.

A substrate, in the sense of the present invention, should be understood to mean an uncoated substrate, and generally has two main faces. The substrate may in particular be an optically transparent material having the shape of an optical article, for example an ophthalmic lens destined to be mounted in glasses. In this context, the term "substrate" is understood to mean the base constituent material of the optical lens and more particularly of the ophthalmic lens. This material acts as support for a stack of one or more coatings or layers.

The substrate may be made of mineral glass or organic glass, preferably organic glass. The organic glasses can be either thermoplastic materials such as polycarbonates and thermoplastic polyurethanes or thermosetting (cross-linked) materials such as diethylene glycol bis(allylcarbonate) polymers and copolymers (in particular CR-39® from PPG Industries), thermosetting polyurethanes, polythiourethanes, preferably polythiourethane resins having a refractive index of 1.60 or 1.67, polyepoxides, polyepisulfides, such as those having a refractive index of 1.74, poly(meth)acrylates and copolymers based substrates, such as substrates comprising (meth)acrylic polymers and copolymers derived from bisphenol-A, polythio(meth)acrylates, as well as copolymers thereof and blends thereof. Preferred materials for the lens substrate are polycarbonates (PC) and diethylene glycol bis(allylcarbonate) polymers, in particular substrates made of polycarbonate.

Specific examples of substrates suitable to the present invention are those obtained from thermosetting polythiourethane resins, which are marketed by the Mitsui Toatsu Chemicals company as MR series, in particular MR6®, MR7® and MR8® resins. These substrates as well as the monomers used for their preparation are especially described in the U.S. Pat. Nos. 4,689,387, 4,775,733, 5,059,673, 5,087,758 and 5,191,055.

Prior to depositing functional coatings, the surface of the article is usually submitted to a physical or chemical surface activating and cleaning pre-treatment, so as to improve the adhesion of the layer to be deposited, such as disclosed in WO 2013/013929. This pre-treatment is generally performed on the surface of the abrasion- and/or scratch-resistant coating (hard coat).

This pre-treatment is generally carried out under vacuum. It may be a bombardment with energetic species, for example an ion beam method ("Ion Pre-Cleaning" or "IPC") or an electron beam method, a corona treatment, an ion spallation treatment, an ultraviolet treatment or a plasma treatment under vacuum, using typically an oxygen or an argon plasma. It may also be an acid or a base surface treatment and/or a solvent surface treatment (using water or an organic solvent) with or without ultrasonic treatment.

Many treatments may be combined. Thanks to these cleaning treatments, the cleanliness of the substrate surface is optimized.

By energetic species, it is meant species with an energy ranging from 1 to 300 eV, preferably from 10 to 150 eV, and more preferably from 10 to 150 eV and most preferably from 40 to 150 eV. Energetic species may be chemical species such as ions, radicals, or species such as photons or electrons.

The substrate's main surface can be coated with several functional coating(s) to improve its optical and/or mechanical properties. The term "coating" is understood to mean any layer, layer stack or film which may be in contact with the substrate and/or with another coating, for example a sol-gel coating or a coating made of an organic resin. A coating may be deposited or formed through various methods, including wet processing, gaseous processing, and film transfer. The functional coatings used herein can be selected from, without limitation to these coatings, an impact-resistant coating, an abrasion-resistant and/or scratch-resistant coating (hard coat), an interferential coating such as an antireflection coating, a polarized coating, a photochromic coating, an antistatic coating, an anti-fouling coating (hydrophobic and/or oleophobic coating), an antifog coating, a precursor of an antifog coating or a stack made of two or more such coatings.

The primer coatings improving the impact resistance and/or the adhesion of the further layers in the end product are preferably polyurethane latexes or acrylic latexes. Primer coatings and abrasion-resistant and/or scratch-resistant coatings may be selected from those described in the application WO 2007/088312.

The interferential coating may be virtually any interferential coating conventionally used in the field of optics, in particular ophthalmic optics. The interference coating may be, in a non-limiting manner, an antireflection coating, a reflective (mirror) coating, an infrared filter or an ultraviolet filter, but is preferably an antireflection coating.

The antireflection coating may be any antireflection coating traditionally used in the optics field, particularly ophthalmic optics. As is also well known, antireflection coatings traditionally comprise a monolayered or a multilayered stack composed of dielectric materials (generally one or more metal oxides) and/or sol-gel materials and/or organic/inorganic layers such as disclosed in WO 2013/098531. These are preferably multilayered coatings, comprising layers with a high refractive index (HI) and layers with a low refractive index (LI).

The structure and preparation of antireflection coatings are described in more details in patent application WO 2010/109154, WO 2011/080472 and WO 2012/153072.

The optical article according to the invention may comprise coatings formed on the interferential coating and capable of modifying the surface properties thereof, such as a hydrophobic and/or oleophobic coating (antifouling top coat). These coatings are preferably deposited onto the outer layer of the interferential coating. Generally, their thickness is lower than or equal to 10 nm, does preferably range from 1 to 10 nm, more preferably from 1 to 5 nm. Antifouling top coats are generally coatings of the fluorosilane or fluorosilazane type, preferably comprising fluoropolyether moieties and more preferably perfluoropolyether moieties. More detailed information on these coatings is disclosed in WO 2012/076714.

Instead of a hydrophobic coating, a hydrophilic coating may be used which provides anti-fog properties (anti-fog coating), or a precursor of an anti-fog coating which provides anti-fog properties when associated with a surfactant. Examples of such anti-fog precursor coatings are described in the patent application WO 2011/080472.

Coatings such as primers, hard coats, antireflection coatings and antifouling coatings may be deposited using methods known in the art, including spin-coating, dip-coating, spray-coating, evaporation under vacuum, sputtering, chemical vapor deposition and lamination.

Typically, an optical article according to the invention comprises a substrate that is successively coated with an impact-resistant primer layer, the anti-abrasion and/or scratch-resistant coating according to the invention, a sublayer and an interferential coating, and a hydrophobic and/or oleophobic coating, or a hydrophilic coating which provides anti-fog properties, or an anti-fog precursor coating.

The present hard coating can also be used as an external layer deposited directly onto the substrate or functional coatings. In another embodiment, it is used as a protective coating to protect against scratches or similar cosmetic defects resulting from physical handling an underlying layer or substrate such as a photochromic layer, as disclosed in WO 2011/075128 or U.S. Pat. No. 6,268,055.

The coatings are preferably directly deposited on one another. These coatings can be deposited one by one, or a stack of one or more coatings can be formed on the substrate, for example by lamination.

In one embodiment, the present optical article is prepared by forming on the substrate the hard coating in a first manufacturing site, while the other coatings are formed in a second manufacturing site.

Now, the preparation of the inventive abrasion- and/or scratch-resistant coating according to the invention from a curable coating composition will be described.

According to the invention, the coating composition is deposited on a substrate in a manner such that, after curing, it forms an abrasion and/or scratch resistant antistatic coating having a thickness of preferably 1 µm or more, preferably from 1 to 100 µm, more preferably from 1 to 10 µm, or 3 to 9 µm, or 4 to 8 µm.

An abrasion resistant coating is a coating, which improves the abrasion resistance of the finished optical article as compared to a same optical article but without the abrasion-resistant coating.

The inventors have found that the coatings of the present invention provide anti-abrasion properties to an article even if layers having a significant thickness, i.e., over 50 nm and preferably less than 1 micron, are deposited onto it.

The compositions described throughout the specification include one or more chemical compounds that are capable when subjected to radiation curing conditions to form polymeric coatings. The materials include unsaturated silane compounds in combination with poly(meth)acrylate compounds. These coating materials can be used together and/or in combination with other materials to make the coating. The coating has sufficient abrasive and/or scratch resistant properties to serve a hard coat on a substrate.

The unsaturated silane used in the hard coat composition is preferably an unsaturated alkoxysilane, and preferably comprises a terminal ethylenic double bond. It can be, e.g., a vinylsilane, an allylsilane, an acrylic silane or a methacrylic silane. It is preferred to employ unhydrolyzed silanes for stability of the composition.

The unsaturated silane has a reactive unsaturation, i.e., said unsaturated part of the silane can take part to a polymerization reaction. A silane containing a phenyl or aryl group is not an unsaturated silane within the meaning of the invention.

Without wishing to be bound by any theory, it is believed that unsaturated silanes allow to increase abrasion resistance, as they are monomers with functional groups with a tough nature to give the final coating some flex without dramatically affecting the crosslink density.

Examples of vinylsilanes are vinyltris(2-methoxyethoxy) silane, vinyltrisisobutoxysilane, vinyltri-t-butoxysilane, vinyltriphenoxysilane, vinyltrimethoxysilane (most preferred unsaturated silane), vinyltriisopropoxysilane, vinyltriethoxysilane, vinyltriacetoxysilane, vinyldimethylethoxysilane, vinylmethyldiethoxysilane, vinylmethyldimethoxysilane, vinylpropyltrimethoxysilane, vinylmethyldiacetoxy-silane, vinylbis(trimethylsiloxy)silane and vinyldimethoxyethoxysilane. An acrylic silane is not considered as a vinyl silane.

Examples of allylsilanes are allyltrimethoxysilane, allyltriethoxysilane, allylpropyltrimethoxysilane and allyltris(trimethylsiloxy)silane.

Examples of acrylic silanes are 3-acryloxypropyltris (trimethylsiloxy) silane, 3-acryloxy-propyl-trimethoxysilane, acryloxy-propylmethyl-dimethoxy-silane, 3-acryloxypropyl-methylbis (trimethylsiloxy) silane, 3-acryloxypropyl-dimethylmethoxysilane, N-(3-acryloxy-2-hydroxypropyl)-3-aminopropyl-triethoxysilane.

Examples of methacrylic silanes are 3-methacryloxypropyltris (vinyldimethoxylsiloxy) silane, 3-methacryloxypropyltris (trimethylsiloxy) silane, 3-methacryloxypropyltris (methoxyethoxy) silane, 3-methacryloxy-propyl-trimethoxysilane, 3-methacryloxypropyl-pentamethyl-disiloxane, 3-meth-acryloxy-propyl-methyldimethoxysilane, 3-methacryloxy-propylmethyl-diethoxy-silane, 3-methacryloxypropyl-dimethyl-methoxysilane, 3-methacryloxy-propyl-dimethylethoxysilane, 3-methacryloxy-propenyl-trimethoxysilane and 3-methacryloxy-propylbis (trimethylsiloxy) methylsilane.

The unsaturated silane compound is preferably a vinyl silane, more preferably a vinyl alkoxysilane, which can be selected from the group consisting of vinyl mono-, di- and tri-alkoxysilanes. The vinyl silane material can be represented by the chemical formula of $R_nSi(OR')_{4-n}$, where R is a vinyl or a substituted vinyl group, n is between 1 and 3, and R' is a linear or branched alkyl group or alkoxyalkyl group. In some instances R' can have having 1 to 5 carbons.

The unsaturated silane compound can be employed at a weight concentration of 30 to 70%, 35 to 65%, 40 to 60%, or 45 to 50%, relative to the weight of the composition. In one embodiment, the unsaturated silane compounds are present in an amount higher than or equal to 30 or 33% by weight, as compared to the composition total weight.

The poly(meth)acrylate compound comprising at least 6 (meth)acrylate groups is a highly cross-linkable material that can form covalent bonds between two or more polymeric chains to form a cross-linkable coating. Non-limiting examples of such compounds include hexa(meth)acrylate compounds, such as dipentaerythritol hexaacrylate, silicone hexaacrylate, silicone hexamethacrylate dipentaerythritol hexamethacrylate, tripentaerythritol octaacrylate, tripentaerythritol methacrylate, sorbitol hexaacrylate, sorbitol hexamethacrylate, urethane hexaacrylate compounds, and urethane hexamethacrylate compounds.

The composition can include from 8 to 70% of poly(meth)acrylate compounds comprising at least 6 (meth)acrylate groups, preferably from 25 to 65% by weight, more preferably from 40 to 60% or 45 to 50% by weight. In one embodiment, the poly(meth)acrylate compounds are present in an amount higher than or equal to 33% by weight, as compared to the composition total weight.

In certain embodiments, the weight ratio of unsaturated silanes to poly(meth)acrylate compounds present in the composition ranges from 0.9 to 1.1, and can be 1:1.

The hard coating composition is prepared in such a manner that said at least one poly(meth)acrylate compound comprising at least 6 (meth)acrylate groups and said at least one unsaturated silane compound represent at least 95% of the weight of polymerizable compounds present in the composition. Both main components of the composition are sufficient to obtain satisfactory abrasion- and/or scratch-resistance properties.

Accordingly, the composition comprises less than 5% by weight as compared to the composition total weight of polymerizable compounds such as (saturated) epoxysilanes, for example γ-glycidoxy propyl trimethoxysilane.

In order to avoid damages such as crazing, the composition preferably comprises less than 5% by weight as compared to the composition total weight of inorganic particles (or fillers), functionalized or not, such as $SiO_2$, more preferably is free from such compounds.

In one embodiment, the composition preferably comprises less than 5% by weight as compared to the composition total weight of polymerizable compounds comprising an epoxy group.

In particular, it is preferred that the composition of the invention comprises less than 5% by weight of colloidal silica as related to the total weight of the composition, more preferably is free from any colloidal silica.

The coating composition comprises at least one photoinitiator, preferably a free radical generating photoinitiator. A photoinitiator is a molecule that creates reactive species (free radicals, cations or anions) when exposed to radiation (UV or visible).

Non-limiting examples, of free-radical photoinitiators that are photoactivatable include but are not limited to xanthones, haloalkylated aromatic ketones, chloromethylbenzophenones, certain benzoin ethers (e.g., alkyl benzoyl ethers), certain benzophenone, certain acetophenone and their derivatives such as diethoxy acetophenone and 2-hydroxy-2-methyl-1-phenylpropan-1-one (e.g., Darocur® 1173, last registered with Burrough Wellcome, North Carolina, US), dimethoxyphenyl acetophenone, benzylideneacetophenone; hydroxy ketones such as (1-[4-(2-hydroxyethoxy)-phenyl]-2-hydroxy-2-methyl-1-propane-1-one) (Irgacure® 2959, last registered with BASF SE Company, Germany), 2,2-di-sec-butoxyacetophenone, 2,2-diethoxy-2-phenyl-acetophenone, 1-hydroxy-cyclohexyl-phenyl-ketone (e.g., Irgacure® 184), alpha amino ketones, particularly those containing a benzoyl moiety, otherwise called alpha-amino acetophenones, for example 2-methyl 1-[4-(methylthio)phenyl]-2-morpholinopropan-1-one (Irgacure® 907), (2-benzyl-2-dimethyl amino-1-(4-morpholinophenyl)-butan-1-one (Irgacure® 369), and benzil ketals, such as ethyl benzoin ether, isopropyl benzoin ether. In some embodiments, the free radical initiator may be selected from one or more of α,α-dimethoxy-α-phenyl acetophenone, and 2-hydroxy-2-methyl-1-phenylpropane-1-one, 1-hydroxycyclohexyl phenyl ketone, and 2,2-dimethoxy-1,2-diphenylethan-1-one. Further representative free radical photoinitiators include but are not limited to acylphosphine oxide type such as 2,4,6,-trimethylbenzoylethoxydiphenyl phosphine oxide, bisacylphosphine oxides (BAPO), monoacyl and bisacyl phosphine oxides and sulphides, such as phenylbis(2,4,6-trimethylbenzoyl)-phosphine oxide (Irgacure® 819); and triacyl phosphine oxides. In some embodiments, combinations of free-radical initiators are preferred.

The photoinitiator is preferably selected from the group consisting of benzophenone compounds, acetophenone compounds, monoacyl and bisacyl phosphine oxides and combinations thereof.

The coating composition preferably comprises from 0.01% to 10%, more preferably from 0.1% to 5% or 1 to 5% photoinitiator by weight relative to the total weight of the composition.

The curable composition according to the invention may also contain various additives conventionally used in polymerizable compositions, in conventional proportions. These additives include additional initiators or catalysts, such as cationic initiators, accelerators, binders, solvents, wetting agents, stabilizers such as antioxidants, UV light absorbers, light stabilizers, anti-yellowing agents, fillers, adhesion promoters, dyes, photochromic agents, pigments, rheology modifiers, lubricants, ionic or non ionic surfactants, fragrances, deodorants, doping agents such as organic acids, pH regulators. They are described, e.g., in the application WO 2016/108061.

Depending on the monomers used (for example, an epoxy compound can be present in the composition), a cationic initiator can be employed, preferably a cationic photoinitiator. Said compound can also be employed to catalyze the condensation of alkoxysilane groups (sol-gel process).

Non-limiting examples of cationic initiators include ones having or containing an aromatic onium salt, including salts of Group VA elements (e.g., phosphonium salts, such as triphenyl phenacylphosphonium hexafluorophosphate), salts of Group VIA elements (e.g., sulfonium salts, such as triphenylsulfonium tetrafluoroborate, triphenylsulfonium hexafluorophosphate and triphenylsulfonium hexafluoroantimonate, triarylsulfoniumhexafluorophosphate, triarylsulfoniumhexafluoroantimonate), and salts of Group VIA elements (e.g., iodonium salts, such as diphenyliodonium chloride and diary) iodonium hexafluoroantimonate). Additional examples may be found in U.S. Pat. No. 4,000,115 (e.g., phenyldiazonium hexafluorophosphates), U.S. Pat. Nos. 4,058,401, 4,069,055, 4,101,513, and 4,161,478. Preferred compounds are diaryliodonium salts and of triarylsulfonium salts.

In one embodiment, the composition does not comprise any cationic initiator.

The coating composition can further include a solvent, suitable for the polymerizable compounds described above. The solvent may be suitable for dispersing any of the components of the described composition. In some embodiments, the solvent is a polar solvent, such as any one or more of primary alcohols and glycols. Non-limiting examples of solvents include methanol, ethanol, propanol, butanol, or is a glycol, including propylene glycol, glycol monoether, and any derivative and variant thereof. The solvent can be used alone or in combination. In some instances, the solvents are anhydrous or substantially dry. In some embodiments, environmentally benign solvents are used. In some embodiments, the coating composition is free of solvent, or free of volatile solvents. Formulations having 100% solids are preferred with certain curing processes and equipment, such as those involving UV curing.

In some instances, a surfactant may also be included. In one or more embodiments, a nonionic surfactant is provided in the coating composition. A non-limiting example is a nonionic fluorosurfactant containing at least one fluoroalkyl or polyfluoroalkyl group, an example of which is a fluoroaliphatic polymeric ester in a glycol solvent (e.g., dipropylene glycol monomethyl ether), such as Novec™ FC-4434 (with 3M™ Company, Minnesota, US). Another non-limiting example is a fluorocarbon containing organically modified polysiloxane in methoxypropanol (e.g., EFKA 3034, having 50% solids, provided by the BASF Company). A representative polymeric fluorocarbon compound containing 100% solids is EFKA 3600. Additional non-limiting examples include but are not limited to poly(alkylenoxy)alkyl-ethers, poly(alkylenoxy)alkyl-amines, poly(alkylenoxy)alkyl-amides, polyethoxylated, polypropoxylated or polyglycerolated fatty alcohols, polyethoxylated, polypropoxylated or polyglycerolated fatty alpha-diols, polyethoxylated, polypropoxylated or polyglycerolated fatty alkylphenols and polyethoxylated, polypropoxylated or polyglycerolated fatty acids, ethoxylated acetylene diols, compounds of the block copolymer type comprising at the same time hydrophilic and hydrophobic blocks (e.g., polyoxyethylene block, polyoxypropylene blocks), copolymers of poly(oxyethylene) and poly(dimethylsiloxane) and surfactants incorporating a sorbitan group.

The coating composition may comprise from 0.05 to 1% by weight of a surfactant, as compared to the composition total weight.

The coating composition can be applied to the substrate using known coating techniques to form the cured coating. The first coating can be formulated as 100% solids or solvent-borne. In one aspect, the composition is formulated with minimal amounts of water or in the absence of water. Non-limiting examples of depositing the coating composition to the substrate include dip coating, spray coating, spin coating, gravure coating, flow coating brush coating or roll-coating. Non-limiting examples of spin-coating radiation cured process, dip coating process or washing pretreatments performed before deposition can be found in in the application WO 2016/108061.

The coating composition can be applied directly to the surface of an untreated or pre-treated substrate, to a functional surface on the substrate, or to an alternative surface (e.g., carrier) and later transferred to the substrate or its functionalized surface. The transfer process can include providing the coating composition to a carrier, and then transferring from the carrier to the substrate, generally via a lamination process that may or may not require an adhesive therebetween. Lamination refers to obtaining a permanent contact between a film which comprises at least one functionality (for example, a hydroxyl group or olefin) and the surface containing the substrate. Lamination may include a heating and/or polymerization step to finalize the adhesion between the layers from the carrier onto the substrate.

When the article comprises an impact resistant primer coating, the abrasion resistant coating composition is preferably deposited onto this impact resistant primer coating.

After coating and optionally drying, the uncured composition is subjected to curing conditions sufficient to form a polymeric coating, preferably without any prior hydrolysis step. The term "cured" refers to polymerization of starting materials to polymers. Cured includes conditions that allow some free functional groups to remain in the polymer matrix The curing conditions can include radiation curing (irradiation with light), which can include visible and/or UV radiation, preferably UV curing. Heat curing can also be combined with radiation curing. The composition can be subjected to temperature and light to obtain a temperature below or at the glass transition temperature (Tg) of the fully cured network in order to achieve maximum properties and form the cured coating. In some embodiments, the curing temperature can be increased in a step-wise fashion to control the rate of curing and prevent excessive heat buildup from the exothermic reaction. In one embodiment, no thermal curing is employed to prepare the hard coating.

The process of preparation of the article may comprise a drying step before the curing step, especially in case an organic solvent has been used. In specific embodiments, the method doesn't comprise any step requiring heating, so that the temperature of the substrate is generally lower than 70° C. during all manufacturing steps. In more specific embodiments, temperature of the substrate is lower than 50° C. during all manufacturing steps.

The curing step can comprise irradiating the coated layer with a UV radiation dosage ranging preferably from 0.15 $J/cm^2$ to 1.20 $J/cm^2$ in the UV-C range (290 nm-100 nm). Irradiation times range preferably from 1 second to 10 seconds. Naturally, it is possible to achieve the same dosage range using a lower intensity bulb for a longer duration.

In a preferred embodiment, the process of preparation of the article does not comprise any hydrolysis step before the curing step. Compositions with hydrolyzed or partially hydrolyzed alkoxysilanes can lead to premature condensation and formation of pre-polymers prior to use, yielding increased viscosity and instability of the composition.

In some embodiments, the composition is subjected to conditions that allow some free functional groups (e.g., hydroxyl or olefins) remain in the composition. Without wishing to be bound to by theory, it is believed that the functional groups bond to the materials used for the subsequent coating (for example an antireflection coating), which adheres the subsequent coating to the inventive hard coating. This type of bonding enables the lenses to be made in the absence of a primer or adhesive layer between any of the described hard coating and a subsequent coating.

The invention also relates to an optical article having a substrate coated on at least one main face with an abrasion- and/or scratch-resistant coating obtained by curing a radiation-curable coating composition as described above.

The invention further relates to a method for manufacturing said optical article, comprising:
- providing an optical article comprising a substrate having at least one main face,
- depositing onto said at least one main face a layer of a radiation curable coating composition as described above, and
- radiation-curing said composition to form an abrasion- and/or scratch-resistant coating.

The optical article substrate is preferably selected from the group consisting of thermoplastic, thermoset, and mineral substrates.

The following examples illustrate the present invention in a more detailed, but non-limiting manner. Unless stated otherwise, all thicknesses disclosed in the present application relate to physical thicknesses. The percentages given in the tables are weight percentages.

EXAMPLES

1. Materials and Methods

The optical articles used in the examples comprised an ORMA® lens substrate from ESSILOR (refractive index of material CR-39: 1.5) or a polycarbonate lens substrate (refractive index: 1.594), having a 65 mm diameter, a power of −2.00 diopters and a thickness of 1.2 mm.

The ORMA® substrates were hand washed with a mild detergent followed by air drying. The washed and dried substrates were subjected to a chemical treatment consisting of a mild caustic (NaOH) detergent wash with ultrasonication followed by neutralization with dilute (5%) acetic acid solution with ultrasonication followed by a deionized water rinse. The CR-39 lenses were then hand washed with a mild detergent solution, rinsed with deionized water and blown dry with filtered air prior to coating.

Polycarbonate substrates were first rinsed with deionized water with ultrasonication and then treated with a dilute aminosilane solution followed by a warm water rinse at 60° C. Prior to coating, these substrates were hand washed with a mild detergent solution, rinsed with deionized water and then blown dry with filtered air.

All radiation cured lenses were coated with a Headway Research bench top spin coater and cured using a Fusion Systems belt conveyor with an ultraviolet/infrared bulb (H+ bulb) under the conditions disclosed in WO 2016/178052.

The lenses were spin coated with the formulations set forth below and subjected to radiation curing conditions. All coated lenses were allowed to sit overnight prior to further processing.

The hard coating thicknesses were 5.5-8 µm, except for example C1 (12 µm) and example C4 (3.5 µm).

2. Testing Methods

The thickness of the layers was controlled by viscosity, application speed and spin off speed (for spin coating). For dip coating, thickness was controlled by viscosity and withdrawal speed.

The haze value H of both the reference and the tested optical article were measured by light transmission as disclosed in WO 2012/173596 utilizing the Haze-Guard Plus hazemeter from BYK-Gardner (a color difference meter) according to the method of ASTM D1003-00 before and after the test has been performed. As haze is a measurement of the percentage of transmitted light scattered more than 2.5° from the axis of the incident light, the smaller the haze value, the lower the degree of cloudiness.

A dry adhesion test, referred to as a crosshatch tape peel adhesion test, was performed on coated articles in accordance with IS™ 02-010, using 3M SCOTCH® no 600 transparent tape, such as disclosed in U.S. Pat. No. 7,476,415 and US 2014/037964.

Determination of Scratch-Resistance: Hand Steel Wool Test (HSW)

The HSW test was implemented on the convex side of the lens only. Waiting time of 24 hours was respected to perform the test.

The lens was manually abraded with a steel wool perpendicularly to fibers direction performing 5 back and forth (with an amplitude from 4 to 5 cm) keeping an index finger constant pressure on the steel wool. Strength pressed on the steel wool can be evaluated with a balance: fix the lens on the balance plate with adhesive tape and press down the lens with the index finger exercising normally strength on the lens. This strength is about 5 Kg during the first way and about 2.5 Kg during the return way. Lenses were visually inspected and noted according to the following table. The higher is the note, the more abraded is the lens. A score of 1 is the best possible score and a score of 5 is the worst.

| Number of scratches | >50 | 11-50 | ≤10 |
|---|---|---|---|
| Note | 5 | 3 | 1 |
| Risk level | High | Acceptable | Low |

3. Results

The following components were used in the inventive and comparative hard coating compositions. 5 different coating compositions were prepared.

| Component | Chemical Type | Chemical name |
|---|---|---|
| Glymo | Epoxysilane | γ-glycidoxypropyltrimethoxysilane |
| VTMO | Unsaturated silane | Vinyltrimethoxysilane |
| M-600 | Hexaacrylate | Dipentaerythritol hexaacrylate |
| GE-30 | Aliphatic epoxy | Trimethylolpropane triglycidylether |
| SR-238 | Diacrylate | 1,6-hexanediol diacrylate |
| UVI-6976 | Cationic photoinitiator | Triarylsulfoniumhexafluoroantimonate |
| UVI-6992 | Cationic photoinitiator | Triarylsulfoniumhexafluorophosphate |
| Darocur 1173 | Free-radical photoinitiator | 2-hydroxy-2-methy-1-phenyl-propane-1-one |
| Irgacure 819 | Free-radical photoinitiator | Phenylbis(2,4,6-trimethylbenzoyl)phosphine oxide |
| EFKA-3034 | Surfactant | Fluorinated surfactant |

| Example COMPONENT | 1 % | C1 % | C2 % | C3 % | C4 % |
|---|---|---|---|---|---|
| Glymo | — | 44.36 | 8.67 | 54.82 | — |
| VTMO | 47.53 | — | 43.37 | — | 54.02 |
| M600 | 47.53 | 44.36 | 43.37 | 21.93 | 21.61 |
| GE-30 | — | — | — | 10.96 | 10.80 |
| SR-238 | — | — | — | 10.96 | 10.80 |
| UVI-6976 | — | 7.32 | 0.09 | 0.44 | 0.07 |
| UVI-6992 | — | 2.44 | 0.03 | 0.15 | 0.02 |
| Darocur 1173 | 3.80 | 1.06 | 3.47 | 0.53 | 2.07 |
| Irgacure 819 | 0.95 | 0.27 | 0.87 | 0.13 | 0.52 |
| EFKA-3034 | 0.20 | 0.18 | 0.17 | 0.07 | 0.07 |
| TOTAL | 100.00 | 100.00 | 100.00 | 100.00 | 100.00 |
| CR-39 Adhesion (dry) | Pass | Pass | Fail | Fail | Fail |
| CR-39 Adhesion after tint | Pass | Pass | Fail | Fail | Fail |
| PC Adhesion (dry) | Pass | Fail | Pass | Pass | Pass |
| PC Adhesion after tint | Pass | Fail | Pass | Pass | Pass |

The compositions of comparative examples C1 and C3 do not comprise any unsaturated silane, but rather other acrylic, epoxy, and/or alkoxysilane monomers.

The compositions of comparative examples C2 and C4 comprise more than 5% by weight of polymerizable compounds that are neither unsaturated silanes nor poly(meth)acrylate compound comprising at least 6 (meth)acrylate groups.

The formulation of example 1 yielded extraordinarily high scratch resistance results as compared to all other tested hard coating compositions (no scratch was observed after the hand steel wool test) and exhibited good adhesion to both CR-39 and PC substrates when tested after curing (dry) and after being exposed to a BPI® black dye tint bath for 15 minutes at 92° C.

The compositions of comparative examples C1 to C4 provided coatings having insufficient adhesion to substrates, showing that the presence of an unsaturated silane and at least 95% by weight of poly(meth)acrylates comprising at least 6 (meth)acrylate groups and unsaturated silanes are essential characteristics of the invention.

One additional testing was performed in order to compare the coating of example 1 with popular commercial or Essilor UV curable coatings used on ophthalmic lenses, using a mechanical steel wool test (000 #steel wool) and a progressive load (increasingly high weights). The lenses had polycarbonate substrates coated on their front faces.

The difference of haze after testing the coated lenses was measured. The lower the haze, the less scratched is the coating.

The following hard coats were tested: HT-850 (solvent-borne tintable coating), HBX-1 (solvent-free non tintable coating), EC-1244GS (tintable coating), UVNV (solvent-free tintable coating), ESS-UV (tintable coating). The results are shown below:

| Hard coat | Example 1 | HT-850 | HBX-1 | EC-1244GS | UVNV | ESS-UV |
|---|---|---|---|---|---|---|
| Average haze after mechanical steel wool | 0.05 | 1.3 | 0.25 | 0.55 | 0.9 | 2.5 |

It can be observed that the coating of example 1 has extremely high scratch resistance surpassing that of the best known UV curable hard coats.

The invention claimed is:

1. A radiation-curable coating composition comprising:
   at least one poly(meth)acrylate compound comprising at least 6 (meth)acrylate groups;
   at least one unsaturated silane compound that is radiation-curable; and
   at least one photoinitiator;
   wherein said at least one poly(meth)acrylate compound comprising at least 6 (meth)acrylate groups and said at least one radiation-curable unsaturated silane compound represent at least 95% of the weight of polymerizable compounds present in the composition; and
   the radiation-curable unsaturated silane compounds are present in an amount higher than or equal to 30% by weight, as compared to the composition total weight.

2. The coating composition of claim 1, wherein the at least one photoinitiator is a free radical generating photoinitiator.

3. The coating composition of claim 1, wherein the composition comprises from 0.1% to 5% photoinitiator by weight relative to the total weight of the composition.

4. The coating composition of claim 1, wherein the photoinitiator is selected from the group consisting of benzophenone compounds, acetophenone compounds, monoacyl and bisacyl phosphine oxides and combinations thereof.

5. The coating composition of claim 1, wherein the poly(meth)acrylate compound is a hexa (meth)acrylate compound.

6. The coating composition of claim 5, wherein the poly(meth)acrylate compound is dipentaerythritol hexaacrylate.

7. The coating composition of claim 1, wherein the radiation-curable unsaturated silane compound is a vinyl silane.

8. The coating composition of claim 7, wherein the radiation-curable unsaturated silane compound is a vinyl alkoxysilane.

9. The coating composition of claim 7, wherein the vinyl silane is a vinyl alkoxysilane selected from the group consisting of vinyl mono-, di- and tri-alkoxysilanes.

10. The coating composition of claim 9, wherein the vinyl silane is vinyltrimethoxysilane.

11. The coating composition of claim 1, wherein the composition further comprises from 0.05 to 1% by weight of a surfactant, as compared to the composition total weight.

12. The coating composition of claim 1, wherein the composition does not comprise any solvent.

13. The coating composition of claim 1, wherein the poly(meth)acrylate compounds are present in an amount higher than or equal to 33% by weight, as compared to the composition total weight.

14. The coating composition of claim 1, wherein the radiation-curable unsaturated silane compounds are present in an amount higher than or equal to 33% by weight, as compared to the composition total weight.

15. An optical article having a substrate coated on at least one main face with an abrasion- and/or scratch-resistant coating obtained by curing a radiation-curable coating composition of claim 1.

16. The optical article of claim 15, wherein the coating has a thickness ranging from 1 to 10 μm.

17. The optical article of claim 15, wherein the optical article is an ophthalmic lens.

18. A method for manufacturing the optical article of claim 15, comprising:

providing an optical article comprising a substrate having at least one main face;

depositing onto said at least one main face a layer of a radiation-curable coating composition of claim 16; and radiation-curing said composition to form an abrasion- and/or scratch-resistant coating.

19. The method of claim 18, wherein the optical article substrate is selected from the group consisting of thermoplastic, thermoset, and mineral substrates.

* * * * *